United States Patent [19]

Dykstra et al.

[11] Patent Number: 4,700,077
[45] Date of Patent: Oct. 13, 1987

[54] ION BEAM IMPLANTER CONTROL SYSTEM

[75] Inventors: Jerald P. Dykstra; Andrew M. Ray, both of Austin; Monroe L. King, Port Lavaca, all of Tex.

[73] Assignee: Eaton Corporation, Cleveland, Ohio

[21] Appl. No.: 836,331

[22] Filed: Mar. 5, 1986

[51] Int. Cl.$^4$ ............................................. G21K 5/08
[52] U.S. Cl. ............................. 250/492.2; 250/441.1
[58] Field of Search ............... 250/440.1, 442.1, 491.1, 250/492.21; 118/728, 729, 500, 503; 204/297 R; 219/121 EX, 121 LY

[56] References Cited

U.S. PATENT DOCUMENTS

| 3,832,948 | 9/1974 | Barker | 101/401.1 |
| 3,920,233 | 11/1986 | Stuckert | 250/442.1 |
| 4,282,924 | 8/1981 | Faretree | 250/443.1 |
| 4,475,223 | 10/1984 | Taniguchi et al. | 250/491.1 |
| 4,514,637 | 4/1985 | Dykstra et al. | 250/397 |

FOREIGN PATENT DOCUMENTS 0142137 6/1980 German Democratic Rep. ..................................... 118/500

*Primary Examiner*—Carolyn E. Fields
*Assistant Examiner*—Paul A. Guss
*Attorney, Agent, or Firm*—Watts, Hoffmann, Fisher & Heinke Co.

[57] ABSTRACT

A scanning ion beam implanter having a wafer support to control the angle of incidence between an ion beam and the wafer. The wafer support preferably bends the wafer into a segment of a cylinder. As the ion beam scans across the curved wafer surface the angle of incidence remains relatively uniform. The support also includes structure for pivoting the bent wafer about a pivot axis. The pivoting of the wafer is synchronized with the scanning of the ion beam to compensate for scanning of the ion beam in a direction transverse to the direction compensated for by the cylindrical curvature of the wafer.

13 Claims, 10 Drawing Figures

ION BEAM IMPLANTER CONTROL SYSTEM

TECHNICAL FIELD

The present invention relates to an ion beam device implantation system and more particularly relates to method and apparatus to control the angle of incidence between an ion beam and a target.

BACKGROUND ART

Monocrystalline silicon wafers of 200 mm (8") diameter are becoming available in sufficient quality and quantity that semiconductor manufacturers will be using this size (and perhaps eventually larger) wafers for device fabrication. One technique for doping silicon wafers is to direct a beam of ions to impinge upon a target wafer to produce controlled concentrations of doping impurities within the wafer. Demand for ion implanters capable of successfully implanting these larger wafers should build as the wafers become available.

A critical parameter of semiconductor ion implant processes is the spatial uniformity of the implanted dose across the wafer. Another critical parameter is the angle of incidence of the ion beam with respect to the wafer and its internal silicon crystal lattice structure (or GaAs lattice or other crystalline substrate). The angle of incidence is important because of the role it plays in the well known phenomenon of channeling which changes the dopant depth profile when incident angle varies as a function of position on the wafer surface. Incidence angle variation also can produce shadowing effects when the implant is performed through a mask to control implanted areas.

As VLSI technology requires smaller and smaller integrated device sizes, implant mask openings get smaller and smaller while mask thickness does not decrease as rapidly. Thus, shadowing effects are becoming more and more important as device performance specifications are becoming more demanding and depth non-uniformities that are spatially distributed across wafers due to channeling variations are also becoming less tolerable.

In medium and low current ion implanters the ion beam has commonly been directed across the wafer surface by x-y deflection scanning of the beam in a raster or similar pattern across the wafer. This has commonly been done using two orthogonal pairs of electrostatic deflection plates to produce the beam deflections. Application of triangular waveform voltage to the plates can produce rectangular raster scan patterns on the wafer. U.S. Pat. No. 4,514,637 to Dykstra et al. discloses one such medium to low current ion implanter. The disclosure of Dykstra et al. patent is incorporated herein by reference.

Electrostatic ion beam deflection as described above results in different angles of beam incidence at different locations on the wafer surface. This is the source of a major depth nonuniformity (from the resulting channeling variations) which occurs in this type of implanter.

Due to the difficulty of transporting heavy high current ion beams long distances, especially in the presence of electrostatic fields, this type of beam scanning to spread the beam uniformly over large wafers has not been practical in high current implanters. High current implanters have tended to scan the wafer past a stationary beam by mechanical means such as attaching the wafers to a spinning disk passing through the beam or by other well known mechanical scanning techniques. In recent years these mechanical scanners have tended to be designed so that as the wafer moves through the ion beam, the angle of beam incidence remains constant or nearly so. For this reason mechanical scanning of wafers through a stationary beam has come to be considered as a superior method to x-y deflection of the beam for producing depth uniformity and minimum mask shadows variation.

The batch handling imposed by the high beam density mechanical scanning techniques have generally resulted in reduced wafer handling throughput and large costly wafer handling stations. X-Y deflection scanning machines on the other hand have advantages in size, simplicity, and cost but suffer from varying angle of beam incidence problems. As wafer diameters become larger the angle of incidence increases unless the length of the beam transport is proportionally increased. A lengthening of the beam path, however, would result in severe problems in beam transport resulting in low delivered beam currents on the target wafer.

Another method of addressing the angle of beam incidence problem has been the use of parallel scanning techniques. In an electrostatic scanning system, this can be accomplished by using 2 sets of deflection plates, each consisting of 2 orthogonal pairs of plates. The first set is used to deflect the beam in a raster or similar pattern, as described above. The second set of plates is then used to deflect the beam back in a direction parallel to the original beam direction. The result of this is a raster scanned beam that has a very nearly constant angle of incidence at all points on the wafer. This technique requires that the second set of plates be spaced at least as far apart as the size of the target. Since the required deflecting voltage is directly proportional to the plate spacing, this technique is generally limited to small wafers. Further, because of the problem of transporting ion beams in electrostatic fields, as previously noted, this technique is also limited to use with low mass and low current ion beams.

Recent experiments have indicated that the effects of varying dopant depth profiles caused by channeling as the angle of incidence changes across the wafer is the most severe contribution to nonuniform sheet resistivity even on small wafers having 3" and 4" diameters for a properly designed x-y system.

DISCLOSURE OF THE INVENTION

The present invention addresses a problem of non-uniformity in incident angle in a scanning ion beam implantation system. The shape of the target is modified to produce a more uniform angle of incidence over the target surface. The invention has particular applicability to silicon wafer implanting. In accordance with this use of the invention, the silicon wafers are bent so that the scanning ion beam strikes the wafer at a uniform angle of incidence across the wafer surface.

The ion implant apparatus of the invention includes a source for directing a beam of ions to a target and an ion beam deflecting mechanism for deflecting the ion beam away from an initial path, to scan the beam across the surface of a target wafer. The wafer is mounted to a structure which both positions the wafer in the beam path and bends the wafer in a concave configuration. This concavity causes the angle of incidence between the ion beam and wafer to be much more uniform as the beam scans across the wafer. In one embodiment of the invention, the wafer is bent to form a section of a sphere and in a second, preferred embodiment, the wafer is bent in the form of a segment of a cylinder. The forces needed to bend the wafer into a segment of the cylinder are easier to apply than those needed to bend the wafer into a segment of a sphere.

The ion beam is deflected across the wafer surface in a zig-zag pattern by controlled applications of voltages to vertical and horizontal deflection plates of the ion beam scanner. As the ion beam scans across the curvature of the cylinder, the angle of incidence is maintained approximately constant due to the bending of the wafer. As the ion beam scans up and down the cylindrical section, however, the angle of incidence is changing. This non-uniformity is corrected by pivoting the cylindrical wafer about a pivot axis and synchronizing this pivoting with the scanning of the ion beam. In a preferred embodiment of the cylindrical wafer implant procedure, a cam drive is coupled to a wafer support to pivot the wafer support in synchronism with the scanning action of the ion beam.

Certain ion implantation procedures require a constant, nonperpendicular angle of incidence between the ion beam and wafer. This criteria is readily accomplished by practice of the invention.

One object of the invention is to control the angle of incidence an ion beam makes as it impinges upon a target in an ion implantation system. This and other objects, advantages and features of the invention will become better understood from a detailed description of a preferred embodiment of the invention described in conjunction with the accompanying drawings.

BEST MODE FOR CARRYING OUT THE INVENTION

Figure 1:
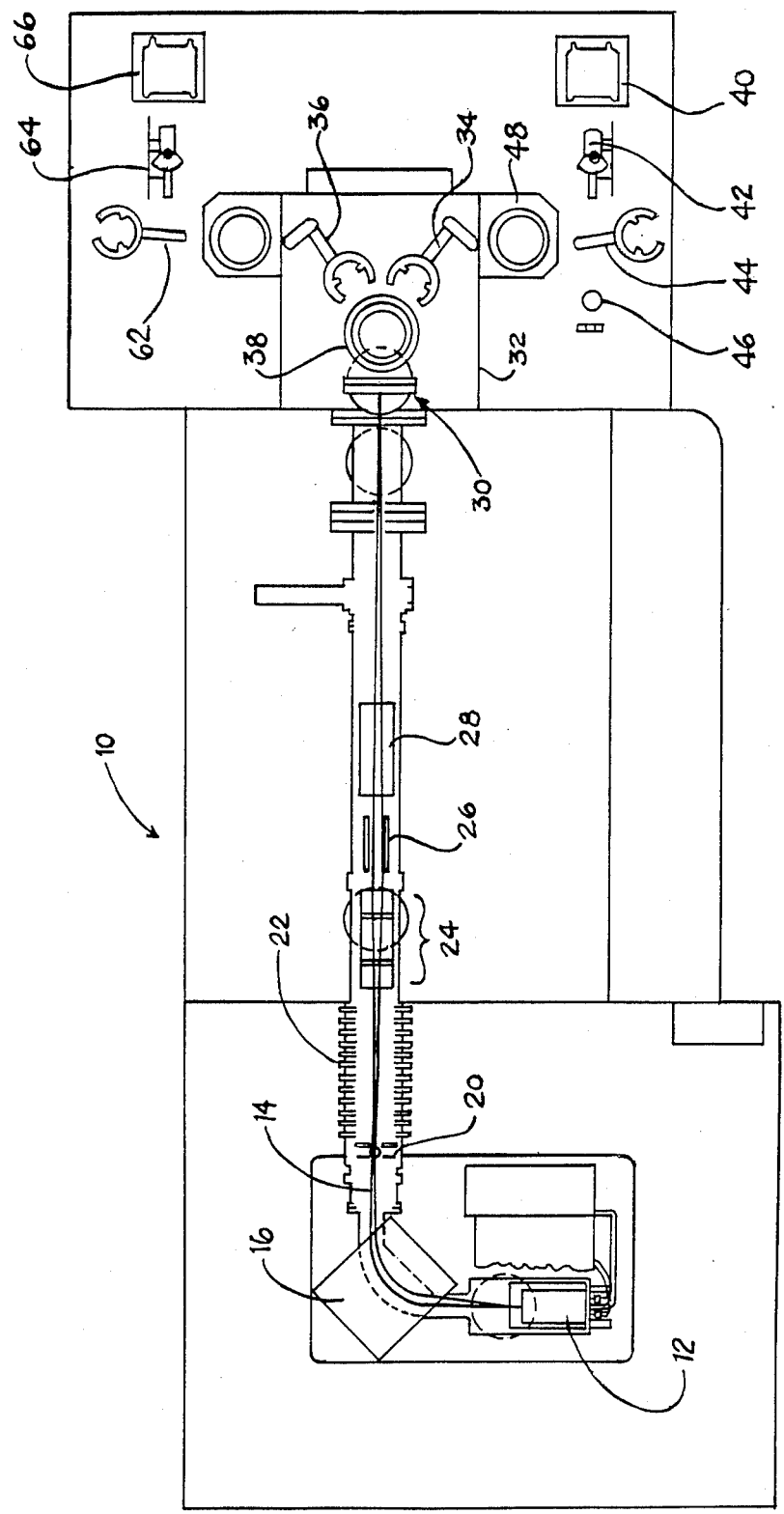
FIG. 1 is a schematic plan view of an ion implantation apparatus.

Turning now to the drawings, an ion implantation system 10 is illustrated having an ion source 12 for directing an ion beam 14 to an ion mass analyzing magnet 16 which bends the beam at right angles and directs the beam along an elongated travel path through a beam shutter 20 and accelerating electrodes 22. Subsequent to acceleration through the electrodes 22, the beam passes through a quadruple lens structure 24 that focuses the beam. The beam 14 then passes through two pairs of deflections plates 26, 28. Control voltages applied to these plates 26, 28 create electric fields which controllably deflect the ion beam 14 in a manner well understood in the ion implantation art. The deflected ion beam is then directed to an ion implantation station 30 where a silicon wafer is positioned in the beam path for ion implantation.

The ion implantation station 30 is located in an evacuated chamber 32. Two arms 34, 36 mounted within the chamber 30 automatically load and unload wafers to and from a wafer support 38. Undoped wafers are retrived from a cassette 40 by a shuttle 42 which brings a single wafer to the vicinity of an arm 44 which moves the undoped wafer to an orienter 46. The orienter rotates the undoped wafer to a particular crystal orientation. The arm 44 retrives the suitably oriented wafer and moves it into a loading station 48 next to the evacuated chamber 32. After evacuating the loading station 48, the arm 34 grasps the wafer, brings it within the chamber and places it on the support 38 at a load/unload position.

On a unload side of the chamber 32, the second arm 36 grasps a doped wafer from the support 38, and removes it from the chamber 32. An arm 62 moves the now doped wafer to a shuttle 64 which automatically places the doped wafer into a second cassette 66.

Figure 2:
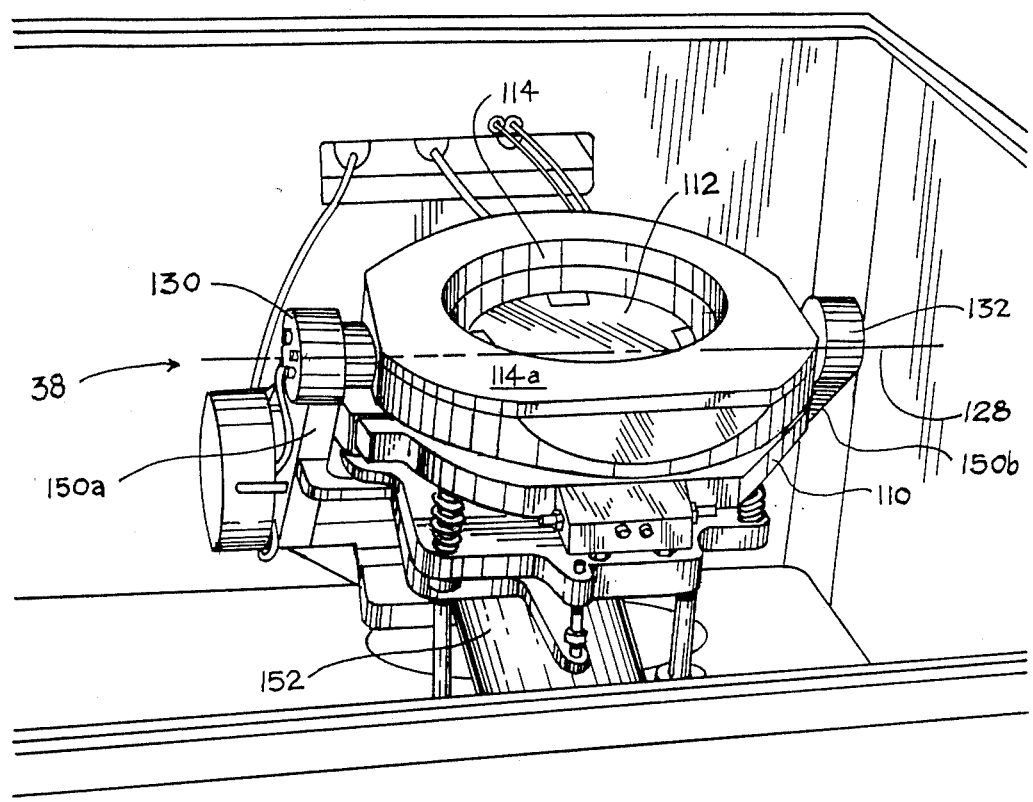
FIG. 2 is a perspective view of a wafer support used in the FIG. 1 system.
Figure 3:
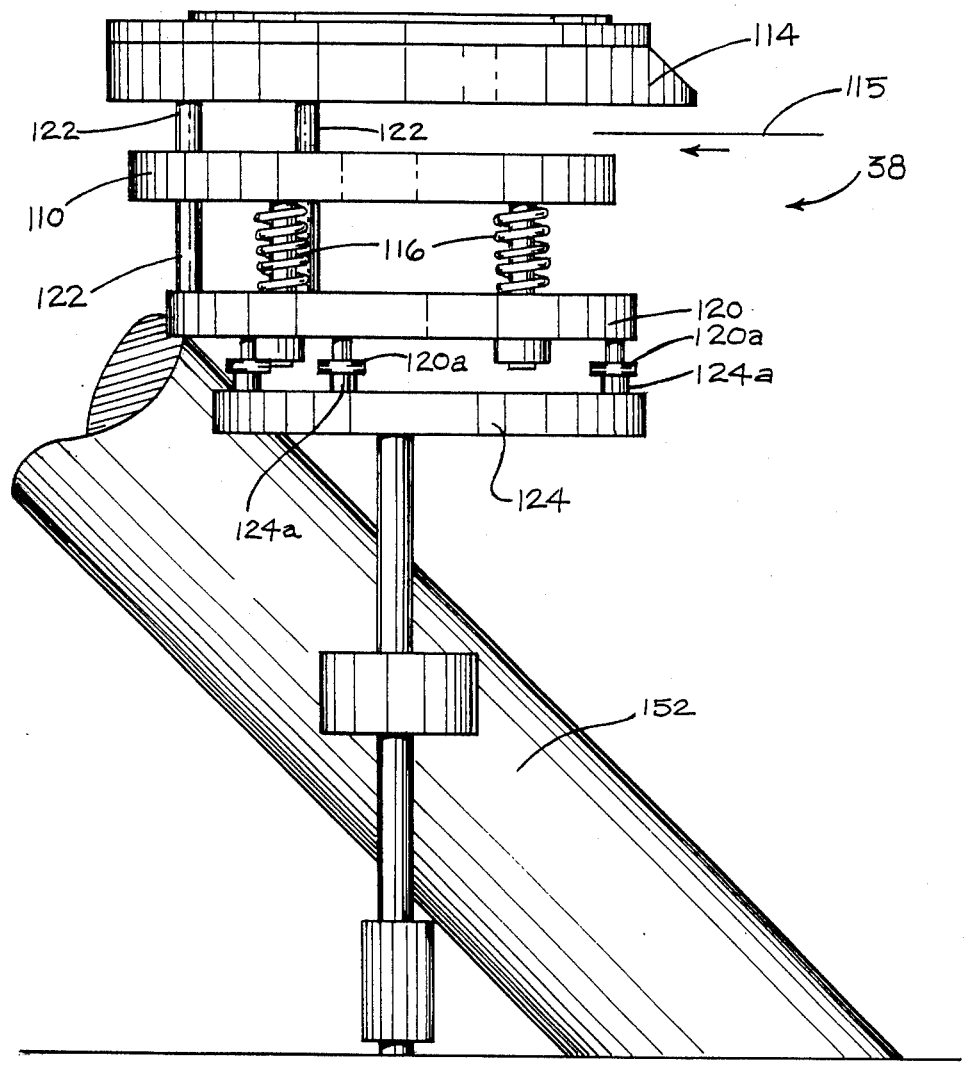
FIG. 3 is a schematic elevation view of a wafer support showing a clamping mechanism for securing the wafer in place.

Turning now to FIGS. 2 and 3, the wafer support 38 is seen to include a main support body 110 that carries a platen 112. The arm 34 places an undoped wafer on the platen by inserting a wafer 115 between the support body 110 and a clamp 114. The clamp 114 is biased toward the support body 110 by compression springs 116 interposed between the support body 110 and a clamp body 120 rigidly coupled to the clamp 114 by connected rods 122 passing through the support body 110.

As seen most clearly in FIG. 3, as the arm 34 moves the wafer 115 into position between the main support body 110 and the clamp 114 the clamp is maintained in an elevated position by a lift yoke 124 that contacts the clamp body 120 to raise and lower the clamp 114. Adjustable thumbscrews 120a threadingly coupled to the clamp body 120 are engaged by buttons 124a carried by the yoke 124. By adjusting the thumbscrews 120a a gap between the support body 110 and clamp 114 is adjusted.

Figure 9:
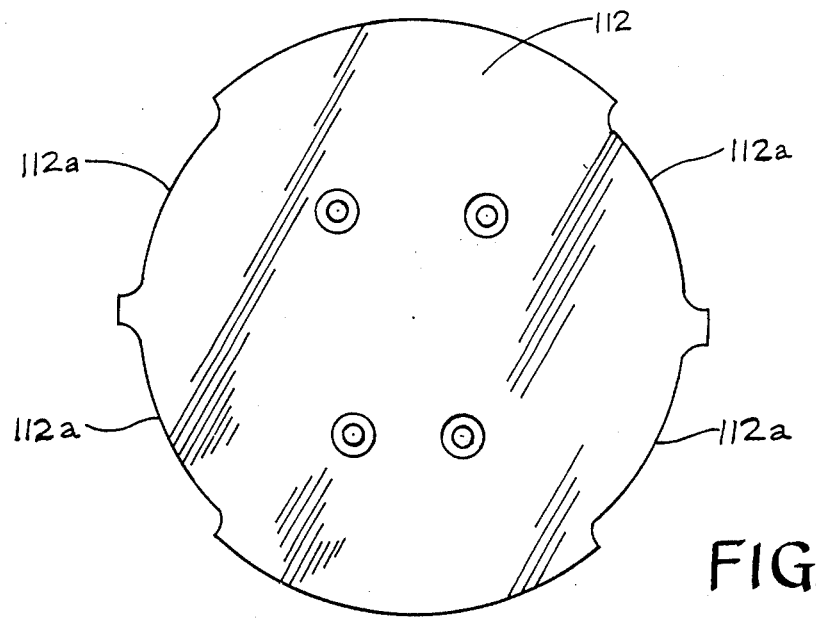
FIG. 9 is a plan view of a wafer support platen that in combination with the wafer clamp bends the wafer into a segment of a cylinder.

Once the wafer has been placed onto the platen 112, the lift yoke 124 is retracted away from the clamp body by a drive (not shown) located outside the evacuated chamber 32. This allows the clamp 114 to be biased against the wafer 115 and hold the wafer in place against the platen 112. The platen 112 (FIG. 9) defines notches 112a about its outer edge that allow the arms 34, 36 to engage a bottom wafer surface while depositing a wafer onto or retreiving a wafer from the platen 112.

Figure 5:
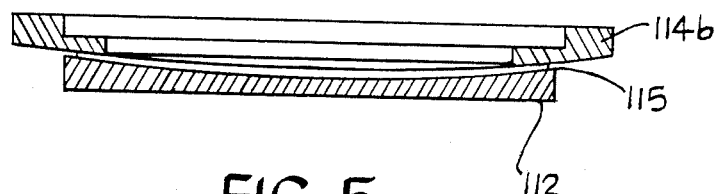
FIG. 5 is a sectioned view of the clamp and a support platen for the wafer.

The clamp 114 is designed to clamp different size wafers. To accommodate these different size wafers the platen 112 is removable from the main support body 110 and can be replaced with platens appropriate for different size wafers. The clamp 114 includes a clamp face 114a and clamp ring 114b which can be removed and replaced for different wafers. The clamp ring 114b is seen in the cross-sectional view of FIG. 5. In a preferred embodiment, the platen and clamp ring define radii of curvature that approximates segments of a cylinder so that when the lift yoke 124 is lowered away from the clamp body 120, the clamp ring 114b bends the wafer into a segment of the cylinder.

Figure 4:
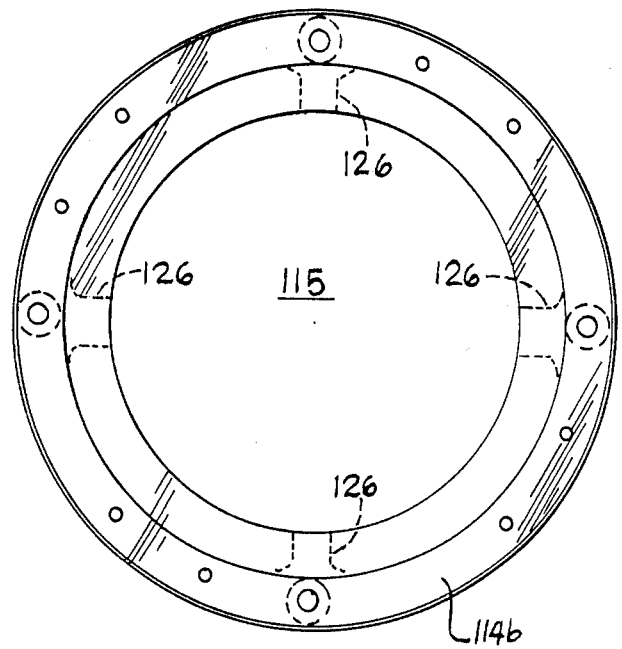
FIG. 4 is a top plan view of a wafer clamp for bending the wafer into a cylindrical segment.

The clamp ring 114b (FIGS. 4, 5) contacts the wafer 115 around its entire outer periphery. This clamp ring 114b is suitable for bending the wafers into both cylindrical and spherical segments. Since the wafer 115 can be bent into a segment of a cylinder with less force the clamp ring 114b can be modified to engage the wafer 115 only through contact fingers 126 equally spaced about the clamp ring 114b. This clamping mechanism has the advantage that less of the wafer is covered by the ring 114b and consequently more of the wafer is implanted.

As seen most clearly in FIG. 2, the support body 110 is pivotally mounted so that a platen surface approximately coincides with a pivot axis 128 about which the support body 110 rotates. Bearings 130, 132 on either side of the support body 110 journal the support body 110 for rotation on two parallel support members 150a, 150b. These support members 150a, 150b are coupled to a main drive shaft 152 that moves the support 38 from the load/unload position (FIG. 2) to the ion doping position where the wafer 115 is oriented to face the ion beam.

Figure 6:
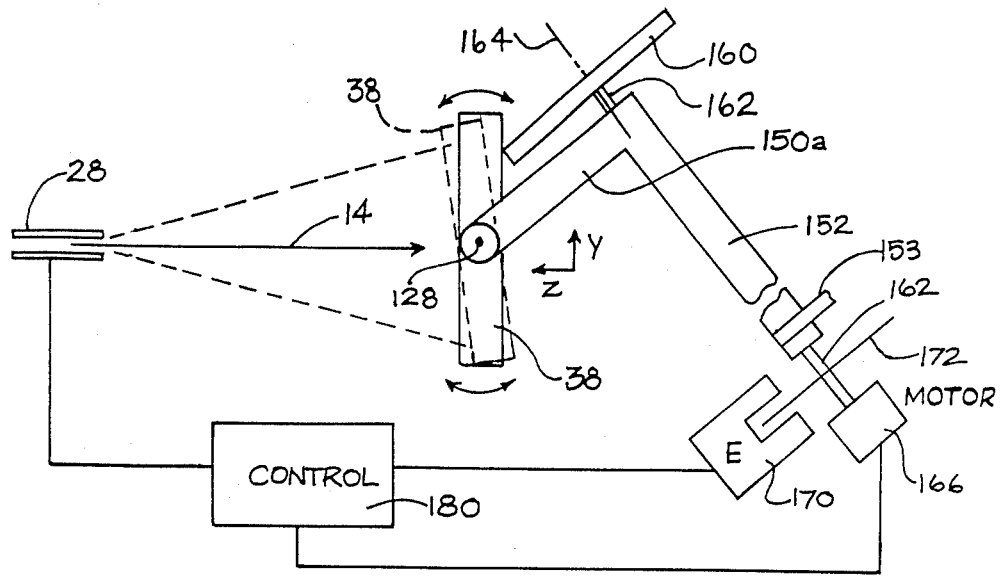
FIG. 6 is a schematic illustration showing apparatus for pivoting the wafer support into a ion beam impingement position and for coordinating pivoting of the wafer support with ion beam scanning of a wafer.

The main shaft 152 is oriented at a 45° angle within the evacuated chamber 32. Rotation of the shaft 152 by a belt or gear drive 153 (FIG. 6) outside the chamber 32 moves the support 38 from a load/unload position where the wafer 115 is oriented in a generally horizontal plane to a beam impiegement position where the wafer is oriented in a generally vertical plane and is treated by the ion beam 14.

Figure 7:
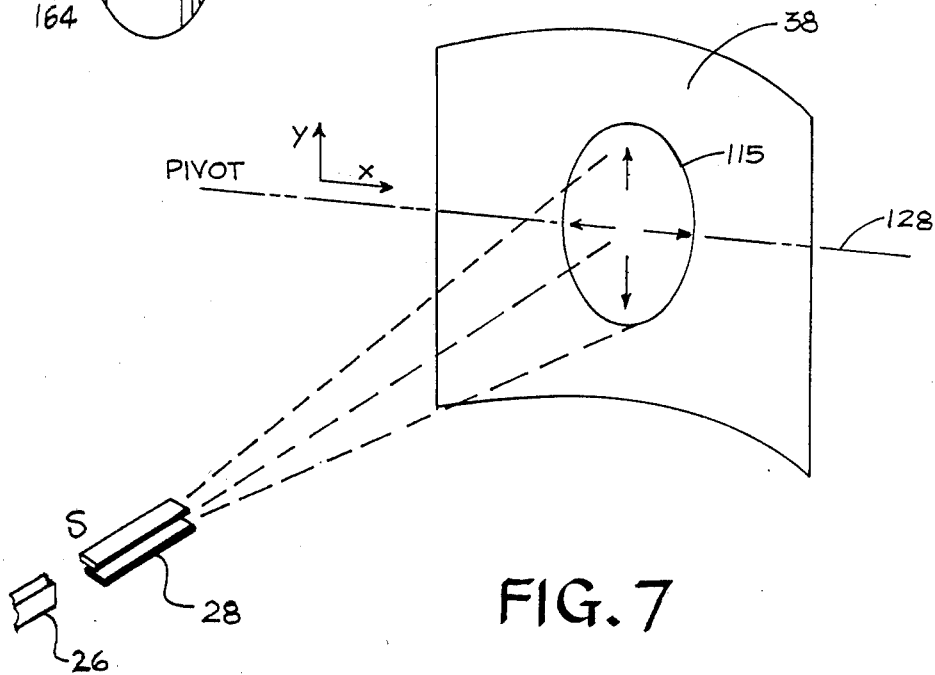
FIG. 7 is a schematic showing an ion beam impinging upon a pivoting cylindrical wafer.

FIG. 7 schematically illustrates a wafer 115 that has been bent into a segment of the cylinder (greatly exaggerated in FIG. 7) that is being treated by an ion beam that has been deflected by the deflection plates 26, 28. The curvature of the silicon wafer imposed by the clamp face 114b compensates for nonuniformities in the angle of impingement between the beam and the wafer as voltages on the plates 26 cause the beam to scan from side-to-side (in the x direction) as seen in FIG. 7.

Compensation in the y direction (as seen in FIG. 7) is accomplished by a pivoting action applied to the support 38 in synchronism with the vertical scanning or deflection imposed on the ion beam 14 by the deflection plates 28.

A presently preferred technique for controlled pivoting of the support 38 (and wafer 115) is through a rotatably mounted cam 160 (FIG. 6) that drives the support 38 back and forth about its pivot axis 128. The cam 160 is supported on a cam shaft 162 that defines an axis of rotation 164 for the cam 160. As a drive motor 166 rotates the cam 160, engagement between the cam 160 and support 38 pivots the wafer 115 about the pivot axis 128.

Figure 6A:
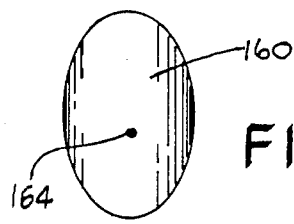
FIG. 6A is a plan view of a cam for imposing a pivoting motion to a wafer support.

The motor 166 can either drive the shaft 162 continuously in the same direction or cylically reverse the direction of cam rotation. The cam 160 shown in FIG. 6A is symmetric and is therefore suitable for a continuously rotating cam.

An optical encoder 170 monitors orientation of the shaft 162 by monitoring an encoder disk 172 attached to the shaft 162. The encoder 170 monitors orientation of the disk 172 and generates sync pulses that are transmitted to a control system 180 that synchronizes the generation of scanning voltages on the plates 28 with the orientation of the support 38. This assures the beam 14 is deflected to strike the wafer 115 at a controlled angle of incidence.

As an alternate and preferred control technique beam deflection angle signals are provided by the scan voltage generation circuit within the control system 180. This information is then fed to a servo amplifier that compares the deflection angle signal with a signal from the encoder 170 indicating the actual cam orientation. A difference signal is used to energize the motor 166 (preferably a stepper motor) to reduce the difference and orient the wafer 115 at a proper angle with respect to the beam.

Both control methods can be implemented to achieve incident angles of other than 90° between the beam 14 and wafer. This capability is important for certain ion implantation procedures. Geometric considerations in combination with specially designed cams, clamps, and platens provide this non-perpendicular beam implantation.

Figure 8:
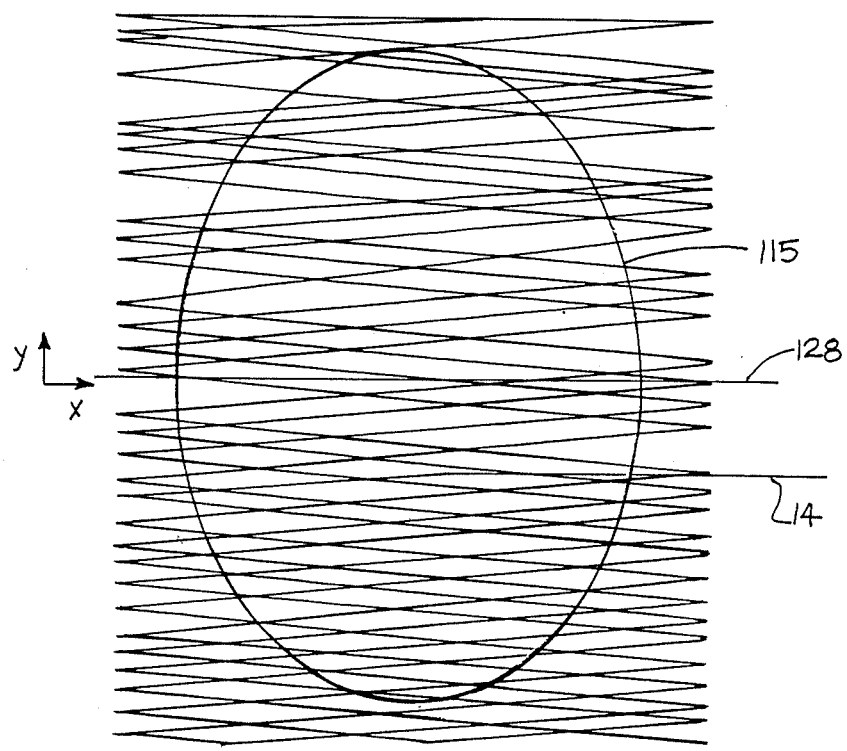
FIG. 8 is a schematic showing a scanning pattern for an ion beam across a wafer bent in the form of a cylinder.

FIG. 8 depicts an illustrative and presently preferred beam scanning procedure. The beam 14 sweeps across the wafer 115 in a zigzag fashion. The scanning frequency is greater in the "x" direction where the incident angle is corrected by the curvature of the wafer 115 than in the "y" direction where the incident angle is corrected by the pivoting of the wafer. The beam 14 is seen to overscan the wafer 115. The degree of overscan may be non-symetric about the pivot axis 128. The stepper motor pivoting is preferred, since the stepper motor can more easily accommodate this possible non-symmetry is beam scanning.

A preferred control system 180 comprises a microprocessor executing a control algorithm to monitor output signals indicative of the encoder position and beam sweep voltages. Suitable interfaces between the encoder 170, deflection plates 28 and motor 166 are also included.

While the present invention has been described with a degree of particularity, it is the intent that the invention include all modifications and alterations from the disclosed design falling within the spirit or scope of the appended claims.

We claim:

1. Ion beam implant apparatus comprising:
   (a) source means for directing an ion beams along an initial trajectory;
   (b) support means for positioning a target wafer within the beam and bending said target wafer from a planar to a concave configuration having a concave surface facing the beam that approximates a segment of a cylinder;
   (c) beam deflecting means for deflecting said ion beam away from the initial trajectory to scan said beam across the concave surface of the target wafer in a controlled pattern to inject a relatively uniform dose of ion impurities into the target wafer;
   (d) pivot means for pivoting the support means about a pivot axis as the beam scans across the concave surface of the target wafer; and
   (e) control means for coordinating pivoting of the support means with deflection of the ion beam to control an angle of incidence between said ion beam and the target wafer as the beam scans across the concave surface of the target wafer.

2. The apparatus of claim 1 wherein the target wafer is a disk and wherein coordinated pivoting of the support means with deflection of the ion beam maintains a relatively uniform angle of incidence between the ion beam and the disk.

3. The apparatus of claim 1 wherein the beam deflecting means comprises two sets of beam deflecting plates spaced along a beam path wherein said plates deflect the beam in generally orthogonal directions, and wherein said concave configuration of the target wafer compensates for deflections of a first set of plates and the controlled pivoting of said target wafer compensates for deflections of a second set of plates to maintain the angle of incidence relatively uniform as the beam scans across the target wafer.

4. The apparatus of claim 1 wherein the support means comprises a clamping means for pressing the target wafer against a concave platen supported for pivoting about said pivot axis.

5. The apparatus of claim 4 wherein the control means comprises a motor and camming means driven by the motor that engages the support means for pivoting the platen.

6. A method for controlling ion implantation of a target comprising the steps of:
bending a generally planar target to form a concave surface of said target that approximates a concave section of a cylinder;
supporting the target for rocking motion about a pivot axis;
directing a ion beam to impact the concave surface of said target;
deflecting said ion beam to scan across said concave surface of the target in a pattern to inject a uniform dose of ion impurities into said target; and
pivoting said target about said pivot axis in synchronism with the scanning of said beam across said target to diminish variations in an angle of incidence between the concave surface of the target and ions impacting the concave surface.

7. The method of claim 6 wherein the beam scanning is performed by controlling a voltage on two sets of orthogonal scanning plates and wherein the pivot axis and a first orthogonal scanning direction are generally parallel to each other.

8. The method of claim 7 wherein the pivot axis is transverse to a center axis of the cylinder approximated by the concave surface of said target.

9. Ion beam implant apparatus comprising:
(a) source means for directing an ion beam along an initial trajectory;
(b) support means for positioning a generally planar, circular wafer within the ion beam so that a wafer center is impacted by ions traveling along the initial trajectory, said support means including a platen and a clamping means bending said wafer from a planar to a concave configuration that approximates a portion of a sphere to maintain an angle of incidence between the beam and a target surface as the beam scans across the target; and
(c) beam deflecting means for deflecting said ion beam away from the initial trajectory to scan the ion beam across a concave surface of the wafer positioned within the ion beam; said beam deflecting means positioned along the initial trajectory a distance from the support means approximately equal to a radius of curvature imposed on the wafer by the platen and clamping means.

10. The ion beam implant apparatus of claim 9 wherein the support means orients the circular wafer so that ions striking the center of the wafer impact the wafer at an angle of other than ninety degrees.

11. A method for controlling ion implantation of a target comprising the steps of:
bending a generally planar, circular target to create a concave surface of said target approximating a section of a sphere to be impacted by an ion beam;
directing a beam of ions to impact the concave surface at a center of said circular target and at a predetermined angle of incidence; and
deflecting said ion beam to scan across said concave surface in a controlled pattern while maintaining the predetermined angle of incidence between the beam and the concave surface to inject a uniform dose of ion impurities into the target.

12. The method of claim 11 wherein the planar, circular target is oriented within the beam of ions so that ions that are not deflected impact the target center at an angle of incidence of other than ninety degrees.

13. Ion beam implant apparatus comprising:
(a) source means for directing an ion beam to a wafer target;
(b) two sets of scanning electrodes for deflecting said ion beam away from an initial trajectory to scan across a target surface of said wafer;
(c) a platen means having a concave surface that approximates a section of a cylinder for supporting a wafer within an ion beam path as the electrodes scan the beam across a target surface of said wafer;
(d) clamping means for bending said target from a planar to a concave configuration against the concave surface of the platen;
(e) camming means for pivoting the platen and wafer about a pivot axis; and
(f) control means for coordinating pivoting of the wafer with a control voltage applied to one of said two sets of scanning electrodes to control an angle of incidence between said ion beam and the wafer as the beam scans across the concave surface of the wafer as the camming means pivots the platen means.

* * * * *